United States Patent [19]

Morgan

[11] Patent Number: 4,749,882
[45] Date of Patent: Jun. 7, 1988

[54] APPARATUS AND METHOD FOR APPLYING RAPID TRANSIENT SIGNALS TO COMPONENTS ON A PRINTED CIRCUIT BOARD

[75] Inventor: David K. Morgan, Hopkinton, Mass.

[73] Assignee: Digital Equipment Corporation, Maynard, Mass.

[21] Appl. No.: 890,766

[22] Filed: Jul. 25, 1986

[51] Int. Cl.$^4$ ............................................. H03K 21/10
[52] U.S. Cl. ................................. 307/263; 307/451; 307/270; 307/579
[58] Field of Search ............... 307/263, 268, 270, 448, 307/451, 579, 585, 443, 473, 542, 568

[56] References Cited

U.S. PATENT DOCUMENTS

| | | | |
|---|---|---|---|
| 3,651,340 | 3/1972 | Cliff | 307/540 |
| 4,209,713 | 6/1980 | Satou et al. | 307/200 B |
| 4,329,600 | 5/1982 | Stewart | 307/549 |
| 4,477,741 | 10/1984 | Moser, Jr. | 307/270 |
| 4,553,043 | 11/1985 | Parker | 307/270 |
| 4,638,187 | 1/1987 | Boler et al. | 307/451 |
| 4,647,797 | 3/1987 | Sanwo et al. | 307/263 |

*Primary Examiner*—Stanley D. Miller
*Assistant Examiner*—Timothy P. Callahan
*Attorney, Agent, or Firm*—William W. Holloway; Robert C. Mayes; William C. Cray

[57] ABSTRACT

A circuit implemented in CMOS technology that controls the rise and fall times of signals applied to conducting paths of a printed circuit board. The circuit consists of an input inverter circuit stage that controls the slope of an output signal from the inverter stage produced in response to an input signal. A second stage is implemented as a source follower and, in response to the inverter stage output signal, provides the output signal applied to the conducting paths of the printed circuit board. A final stage of the circuit compensates for the inability of the source follower stage to utilize, because of the characteristics of the CMOS field effect transistors, the range of voltages provided by the power supplies. The circuit, by controlling the rise and fall time of signal applied to the printed circuit board, reduces the ringing (i.e. the signal undershoot or overshoot) that can accompany application of pulsed signals to the printed circuit board.

9 Claims, 2 Drawing Sheets

APPARATUS AND METHOD FOR APPLYING RAPID TRANSIENT SIGNALS TO COMPONENTS ON A PRINTED CIRCUIT BOARD

BACKGROUND OF THE INVENTION

1. Field of the Invention

This invention relates generally to semiconductor circuits and, more particularly, to a semiconductor circuit that can be used to activate an array of components coupled to the etch paths of a circuit board.

2. Description of the Related Art

As the speed at which data processing systems operate has increased, physical effects have become significant that previouisly could be ignored. Specifically, the distributed impedances of the printed circuit board etch paths, that could be ignored when circuit components were operated at lower frequencies, have now become important. These distributed impedances cause the circuit board etch paths to exhibit behavior analogous to the behavior of a transmission line at the increased operating frequencies. As a result, the control of the signal overshoot and undershoot (or ringing) with respect to the power supply potential and the ground (common) potential must be accomplished. For example, when memory array elements are coupled to the circuit board etch paths, the importance of controlling the signal overshoot and undershoot is the result of the strict tolerances specified by the manufacturer for the memory array elements. The ringing of the control signals can be understood in terms of transmission line theory wherein the overshoot and undershoot are the result of reflections when the transmission line is improperly terminated. When the rise and fall time of the applied control signals are less than the time for a reflected signal to return to the point of signal application, then the effects of the distributed impedance of the printed circut can not be ignored. The time T for an applied signal to be reflected and return to the point of application is given by:

$$T = 2 \cdot L \cdot (L_o \cdot C_o)^{\frac{1}{2}} \cdot (1 + C_L/C_o)^{\frac{1}{2}}$$

where:
- $C_L$ is the load capacitance per unit length along a transmission of length L,
- $C_o$ is the capacitance per unit length of the printed circuit board conducting paths,
- L is the length of the printed circuit board conducting paths, and
- $L_o$ is the inductance per unit length of the printed circuit board conducting path.

While the compensation for the signal ringing has been accomplished in the related art, the compensating techniques have not kept pace with the memory element array technology, a technology that has provided a doubling of the memory element density every two or three years.

A need has therefore been felt for a circuit that can control the rise and fall times of signals applied to the printed circuit boards (e.g. with memory array components), and that can be implemented in a technology compatible with the technology used in fabricating the memory array elements.

FEATURES OF THE INVENTION

It is an object of the present invention to provide an improved circuit for applying signals to data processing system circuit boards.

It is a feature of the present invention to provide an improved circuit for reducing the effects of ringing of signals applied to printed circuit boards.

It is another feature of the present invention to provide a circuit for limiting the rise and fall times of signals applied to circuit boards.

SUMMARY OF THE INVENTION

The aforementioned and other features are obtained, according to the present invention, by providing a compensation circuit implemented in CMOS technology that controls the rise and fall of signals applied to conducting paths of a printed circuit board. The circuit provides an inverting input stage with a time constant that limits the slope of the signal produced in response to an input step signal. An intermediate stage provides an output signal that can drive the conducting paths of the printed circuit board. A final stage compensates for certain undesired component characteristics to permit the output signal of the compensation circuit to utilize essentially all of the voltage range available from the power supplies.

These and other features of the present invention will be understood upon reading of the following description along with the drawings.

DESCRIPTION OF THE PREFERRED EMBODIMENT

1. Detailed Description of the Figures

Figure 1A:
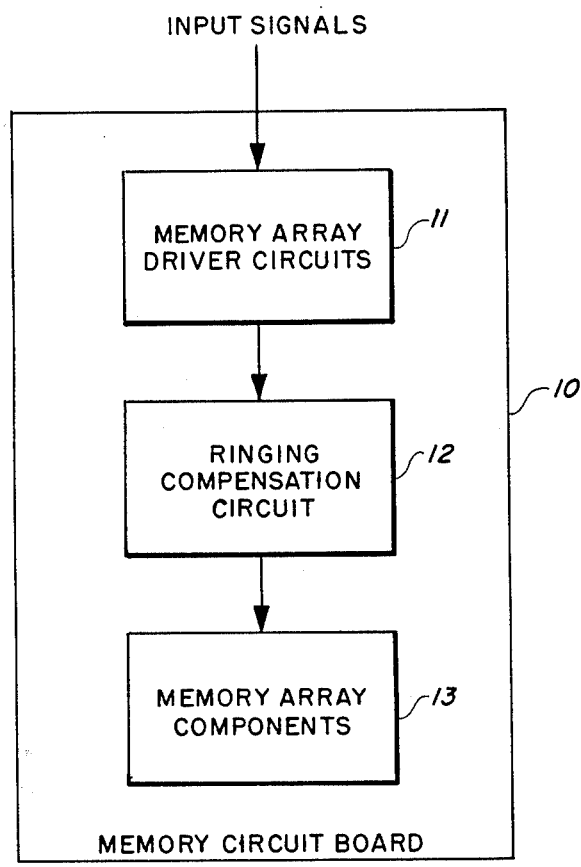
FIG. 1A is a block diagram of components of a memory circuit board indicating the relationship of the present invention.

Referring now to FIG. 1A, the groups of components associated with a memory circuit board board 10 are shown. The memory array driver circuits 11 receive signals from the remainder of the data processing system and determine when, and to which terminals, a signal is to be applied to memory array components 13. The ringing compensation circuit 12 provides the circuit elements maintaining the rise and fall times of the signals driving the memory array elements within acceptable tolerances. In the related art, circuit 12 can be implemented by an external resistor where the resistor dampens the frequency characteristics of output signals from a commercially available driver circuits 11. As a consequence, signal ringing is not able to take place on the printed circuit board etch paths. This limiting technique can result in inefficient use of the circuit board area as well as requiring an addition component to be coupled to the circuit board during fabrication.

Figure 2:
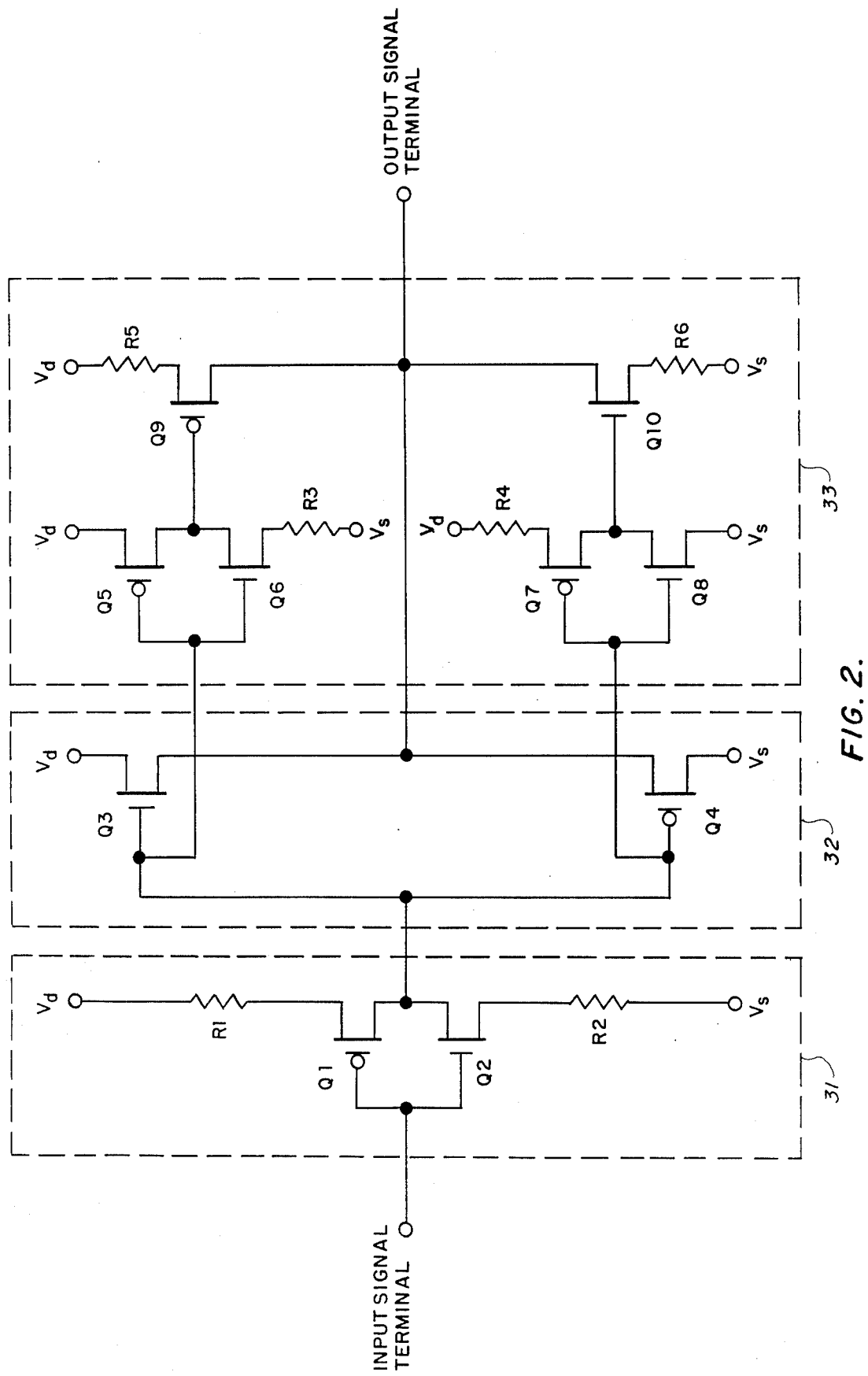
FIG. 2 is a schematic diagram of the circuit used for activation of circuit board conducting paths according to the present invention.

Referring now to FIG. 2, a schematic diagram of the circuit for controlling the rise and fall times of signals applied to the RAM memory elements is shown. The input signal is typically generated by a CMOS circuit and is applied to the gate terminal of p-channel FET transistor Q1 and to the gate terminal of p-channel FET transistor Q2. The source terminal of transistor Q1 is coupled through resistor R1 to voltage supply Vd, while the source terminal of transistor Q2 is coupled through resistor R2 to voltage supply Vs. The drain terminal of transistor Q1 is coupled to the drain terminal of transistor Q2. These two drain terminals are coupled to a gate terminal of n-channel FET transistor Q3, to a gate terminal of p-channel FET transistor Q4, to a gate terminal of p-channel FET transistor Q5, to a gate terminal of n-channel FET transistor Q6, to a gate terminal of p-channel FET transistor Q7 and to gate terminal of n-channel FET transistor Q8. The drain terminal of transistor Q3 is coupled voltage supply Vd, while the source terminal of transistor Q3 is coupled to the output signal terminal and to the source terminal of transistor Q4. The drain terminal of transistor Q4 is coupled to the voltage supply Vs. The source terminal of transistor Q5 is coupled to the voltage supply Vd, while the drain terminal of transistor Q5 is coupled to the drain terminal of transistor Q6 and to a gate terminal of p-channel FET transistor Q9. The source terminal of transistor Q6 is coupled through resistor R3 to voltage supply Vs. The source terminal of transistor Q8 is coupled to voltage supply Vs, while the drain terminal of transistor Q8 is coupled to a drain terminal of transistor Q7 and to a gate terminal of n-channel FET transistor Q10. The source terminal of transistor Q7 is coupled through resistor R4 to voltage supply Vd. The source terminal of transistor Q9 is coupled through resistor R5 to voltage supply Vd, while the drain terminal of transistor Q9 is coupled to the output signal terminal and to a drain terminal of transistor Q10. The source terminal of transistor Q10 is coupled through resistor R6 to the voltage supply Vs.

Figure 1B:
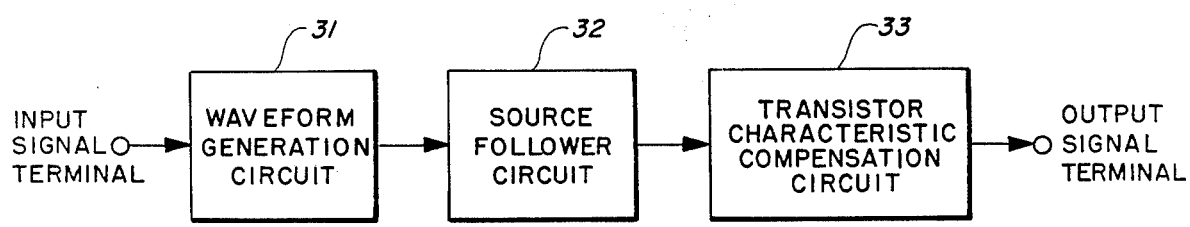
FIG. 1B is a block diagram of the circuit of FIG. 2 indicating the functions of the component groups.

Referring next to FIG. 1B, the function of each component group of FIG. 2 is illustrated. Transistors Q1 and Q2 and associated components form a waveform generation circuit 31 that, in response to an step enable signal, provide the appropriate waveform to prevent ringing of the signals applied to the control lines. Transistors Q3 and Q4 and associated components form a source follower circuit 32 that, through the RC time constant provided by resistors R1 and R2 and the input capacitance of transistors Q3 and Q4, control the slope of the rise and fall times of the input signals to transistor Q3 an Q4. The remainder of the elements of the circuit form element compensation circuit 33 and compensate for physical characteristics of the circuit elements that are inappropriate.

2. Operation of the Preferred Embodiment

Referring once again to FIG. 2, the input or waveform compensation stage 31 employes transistors Q1 and Q2 in a signal inverter stage. In addition, the resistors R1 and R2, in conjunction with the gate capacitance of the transistors Q3 and Q4, provide an RC time constant that limits the response of the inverter stage output signal to a driver circuit input signal. Stated in a different manner, the RC time constant limits the transient response of the circuit to an input signal. The resistors R1 and R2 can be implemented by a p+ diffusion resistor with values to provide an output signal with rise and fall times having values that prevent ringing on the circuit board etch paths.

The intermediate stage, including transistors Q3 and Q4 and associated circuits, is a source follower stage and provides the output signal that is applied to the printed circuit board etch paths via the output signal terminal. The output signal from this stage is essentially the output signal from transistors Q1 and Q2 and consequently has rise and fall times that prevent ringing when applied to the circuit board.

The element compensation circuit 33 is used because the potential drops across transistors Q3 and Q4 are relatively large, preventing the output signal from utilizing a sufficient portion of the voltage range defined by voltage supplies Vd and Vs. To address this problem, the two inverter circuits (including transistors Q5 and Q6 and transistors Q7 and Q8 respectively) are used to provide input signals for opposite channel transistors Q9 and Q10 (as compared to transistors Q3 and Q4 respectively), the transistors Q9 and Q10 having output terminals coupled to the output signal terminal. The initiation of conduction in transistor Q9 and in transistor Q10 is controlled by the associated inverter circuit and is generally implemented to continue the output signal rise and fall. The resistor R3 in conjunction with the input capacitance of transistor Q9 and resistor R4 in conjunction with the input capacitance of transistor Q10 control the rise and fall times of the output signals of transistor Q9 and transistor Q10 respectively.

The disclosed circuit can be used with and can be incorporated in the driver circuits normally used to activate the etch paths of a printed circuit board, both circuit types being implemented in CMOS technology. In addition, the invention is not limited to memory circuit boards, but can be used with any type of circuit board requiring transient control of the driving signals.

Although the present invention has been described in relationship to application of high frequency signals to a printed circuit board, it will be clear to those skilled in the art that the present circuit can be used to control the transient characteristics of of signals applied to any circuit.

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by the spirit and scope of the invention.

What is claimed is:

1. Apparatus for activation of components on a circuit board, said circuit board having a first and a second power supply terminal, comprising:
   (a) a first circuit stage providing an inverted signal to an inverted signal terminal in response to an input signal, said first stage coupled between said first and said second power supply terminals and including:
   (i) a first and second input resistance;
   (ii) a first p-channel transistor having said input signal applied to a gate terminal and having a drain terminal coupled to said inverted signal terminal, and
   (iii) a first n-channel transistor having said input signal applied to a gate terminal and having a drain terminal coupled to said inverted signal terminal;
   (b) a second circuit stage coupled between said first and second power supply terminals including:
   (i) a second n-channel transistor having a gate terminal coupled to said inverted signal terminal, a source terminal coupled through said first input resistance to said first power supply terminal and having a source terminal coupled to an output terminal, and (ii) a second p-channel transistor having a gate terminal coupled to said inverted signal terminal, a source terminal coupled through said second input resistance to said second power supply terminal and having a source terminal coupled to said output terminal;

(c) a third circuit means coupled to said second n-channel transistor gate terminal, coupled to said first power supply terminal and coupled to said output terminal for extending a range of output voltage levels applied to said output terminal; and (d) a fourth circuit means coupled to said second p-channel resistor gate terminal, coupled to said second power supply terminal and coupled to said output terminal for extending a range of output voltage levels applied to said output terminal.

2. The apparatus for activation of components on a circuit board of claim 1 wherein said first circuit stage, said second circuit stage, said third circuit means and said fourth circuit means are implemented in CMOS technology.

3. The apparatus for activation of components on a circuit board of claim 1 wherein said third circuit means includes:

a third p-channel transistor having a drain terminal coupled to said output terminal and having a source terminal coupled to said first power supply terminal;

a fourth p-channel transistor having a source terminal coupled to said first power supply terminal, a gate terminal coupled to a gate terminal of said second n-channel transistor and a drain terminal coupled to a gate terminal of said third p-channel transistor, and a third n-channel transistor having a source terminal coupled to said second power supply terminal, having a gate terminal coupled to said second n-channel transistor gate terminal and having a drain terminal coupled to said third p-channel transistor gate terminal;

and wherein said fourth circuit means includes:

a fourth n-channel transistor having a drain terminal coupled to said output terminal and having a source terminal coupled to said second power supply terminal;

a fifth p-channel transistor having a source terminal coupled to said first power supply terminal, a gate terminal coupled to a gate terminal of said second p-channel transistor and drain terminal coupled to a gate terminal of said fourth n-channel transistor; and a fifth n-channel transistor having a source terminal coupled to said second power supply terminal, a gate terminal coupled to said gate terminal of said second p-channeol transistor and drain terminal coupled to said fourth n-channel gate terminal.

4. The apparatus for activation of components on a circuit board of claim 3 wherein said second circuit stage second n-channel transistor and said second p-channel transistor function as a source follower circuit.

5. The apparatus for activation of components on a circuit board of claim 4 further comprising:

a first resistor coupled between said source terminal of said first n-channel transistor and said first power supply terminal; and a second resistor coupled between a source terminal of said first p-channel transistor and said second power supply terminal; said first and said second resistors and input capacitances of said second p-channel and said second n-channel transistors limiting rise and fall times of signals applied to said second stage.

6. Apparatus for applying an input signal to conducting paths of a circuit board, said paths having components coupled thereto, said circuit board including a power supply having a positive and a negative terminal, comprising:

a first complementary transistor pair, said first transistor pair including;

a p-channel transistor having a source terminal coupled to said positive terminal and a gate terminal having said input signal applied thereto, and an n-channel transistor having a source terminal coupled to said negative terminal and a gate terminal having said input signal applied thereto, wherein drain terminals of said first p- and n-channel transistors are coupled together;

a second complementary transistor pair, said second transistor pair including;

an n-channel transistor having a drain terminal coupled to said positive terminal and having a gate terminal coupled to said first transistor pair drain terminals, and a p-channel transistor having a drain terminal coupled to said negative terminal and having a gate terminal coupled to said first transistor pair drain terminals, wherein source terminals of said second transistors are coupled to an output terminal;

first means coupled to said positive terminal, to said negative terminal, to said output terminal and to said first transistor pair drain terminals for extending a positive voltage level range of said output terminal; and second means coupled to said positive terminal, to said negative terminal, to said output terminal and to said first transistor pair drain terminals for extending a negative voltage range of said output terminal.

7. The apparatus for applying signals to components of a circuit board of claim 6 wherein said first transistor pair includes:

a first resistor coupled between said p-channel transistor souce terminal and said positive terminal; and a second resistor coupled between said n-channel transistor source terminal and said negative terminal, wherein said first and said second resistor and capacitances of said second transistor pair control a rise time and a fall time for signals applied to said output terminal.

8. Apparatus for applying signals to components of a circuit board of claim 7 wherein said first transistor pair functions as an inverter circuit and said second transistor pair functions as a source follower circuit.

9. The apparatus for applying signals to components of a circuit board of claim 8 wherein said first means comprises:

a fifth p-channel transistor having a drain terminal coupled to said output terminal and a source terminal coupled to said positive terminal; and a third complementary transistor pair including:

a p-channel transistor having a source terminal coupled to said positive supply and a gate terminal coupled to said first transistor pair drain terminals, and an n-channel transistor having a source terminal coupled to said negative terminal and a gate terminal coupled to said first transistor pair drain terminals, wherein drain terminals of said third transistor pair are coupled to a gate terminal of said fifth p-channel transistor; and wherein said second means is comprised of:

a fifth n-channel transistor having a drain terminal coupled to said output terminal and a source terminal coupled to said negative terminal; and a fourth complementary transistor pair including; and a p-channel transistor having a source terminal coupled to said positive supply and a gate terminal coupled to said first transistor pair drain terminals, and an n-channel transistor having a source terminal coupled to said negative terminal and a gate terminal coupled to said first transistor pair drain terminals, wherein drain terminals of said fourth transistor pair are coupled to a gate terminal of said firth n-channel transistor.

* * * * *